(12) United States Patent
Shain

(10) Patent No.: US 11,279,297 B2
(45) Date of Patent: *Mar. 22, 2022

(54) APPARATUS TO AFFIX ELECTRONIC DEVICES TO A VEHICLE HEADREST

(71) Applicant: Michael Shain, Conifer, CO (US)

(72) Inventor: Michael Shain, Conifer, CO (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/090,372

(22) Filed: Nov. 5, 2020

(65) Prior Publication Data

US 2021/0046884 A1    Feb. 18, 2021

Related U.S. Application Data

(62) Division of application No. 16/275,789, filed on Feb. 14, 2019, now Pat. No. 10,857,951.

(60) Provisional application No. 62/630,710, filed on Feb. 14, 2018.

(51) Int. Cl.
*B60R 11/02* (2006.01)
*B60R 11/00* (2006.01)
*H05K 5/02* (2006.01)

(52) U.S. Cl.
CPC .......... *B60R 11/0235* (2013.01); *B60R 11/00* (2013.01); *H05K 5/0204* (2013.01); *H05K 5/0247* (2013.01); *B60R 2011/0017* (2013.01)

(58) Field of Classification Search
CPC ................. B60R 11/02; B60R 11/0235; B60R 2011/0017; B60R 2011/0059; B60R 2011/0071
USPC ....................................................... 224/275
See application file for complete search history.

(56) References Cited

U.S. PATENT DOCUMENTS

| | | |
|---|---|---|
| 4,818,010 A | 4/1989 | Dillon |
| D344,726 S | 3/1994 | Amiya |
| 6,116,485 A | 9/2000 | Watkins |
| 6,273,310 B1 | 8/2001 | Gregory |
| 6,315,180 B1 | 11/2001 | Watkins |
| 7,070,237 B2 | 7/2006 | Rochel |
| 7,637,566 B2 | 12/2009 | Cottrell et al. |
| 7,784,864 B2 | 8/2010 | Feder |
| 7,874,612 B2 | 1/2011 | Cottrell et al. |
| 8,109,569 B2 | 2/2012 | Mitchell |

(Continued)

FOREIGN PATENT DOCUMENTS

| | | |
|---|---|---|
| DE | 19943696 A1 | 3/2001 |
| DE | 10211075621 | 11/2011 |

OTHER PUBLICATIONS

International Search Report dated May 30, 2019 for International Application No. PCT/US 2019/017963.

(Continued)

*Primary Examiner* — Corey N Skurdal
(74) *Attorney, Agent, or Firm* — Harness, Dickey & Pierce, P.L.C.

(57) ABSTRACT

An apparatus is provided to attach an electronic device, such as a printer, to a vehicle headrest of a vehicle seat. The apparatus includes one or more attachment members configured to attach to a vehicle headrest mounting rod; a support structure attached to the one or more attachment members, the support structure extending outward from the one or more attachment members toward an edge of the vehicle headrest; and a back plate attached to the support structure, the back plate configured to hold the electronic device, wherein at least a portion of the electronic device is accessible from the vehicle seat.

20 Claims, 10 Drawing Sheets

(56) References Cited

U.S. PATENT DOCUMENTS

| | | |
|---|---|---|
| 8,336,959 B2 | 12/2012 | Cottrell et al. |
| 8,561,863 B2 | 10/2013 | LaColla et al. |
| 8,857,687 B1 | 10/2014 | An |
| 8,864,226 B2 | 10/2014 | Fan |
| 9,010,597 B2 | 4/2015 | Prescott et al. |
| 9,073,464 B2 | 7/2015 | Cottrell et al. |
| 9,114,766 B1 | 8/2015 | Pelini |
| 9,296,340 B2 | 3/2016 | Ackeret et al. |
| 9,452,718 B1 | 9/2016 | Dry |
| 9,527,456 B2 | 12/2016 | Ackeret et al. |
| 10,471,902 B2 | 11/2019 | Fischer et al. |
| 2002/0162867 A1 | 11/2002 | Watkins |
| 2004/0032541 A1 | 2/2004 | Rochel |
| 2006/0087163 A1 | 4/2006 | Cilluffo et al. |
| 2012/0006870 A1 | 1/2012 | Proctor et al. |
| 2012/0018471 A1 | 1/2012 | Guillermo et al. |
| 2012/0024920 A1 | 2/2012 | Grolle et al. |
| 2012/0125959 A1 | 5/2012 | Kucera |
| 2012/0312847 A1 | 12/2012 | LaColla et al. |
| 2013/0068809 A1 | 3/2013 | Wang |
| 2013/0181492 A1 | 7/2013 | Prescott et al. |
| 2013/0193174 A1 | 8/2013 | Ackeret et al. |
| 2014/0015289 A1 | 1/2014 | Fan |
| 2014/0077576 A1 | 3/2014 | Brawner |
| 2015/0306996 A1 | 10/2015 | Cottrell et al. |
| 2017/0313259 A1 | 11/2017 | Minn et al. |
| 2017/0313260 A1 | 11/2017 | Minn et al. |

OTHER PUBLICATIONS

Non-Final Office Action dated Jan. 9, 2020 in U.S. Appl. No. 16/275,789.

Notice of Allowance dated Sep. 23, 2020 in U.S. Appl. No. 16/275,789.

APPARATUS TO AFFIX ELECTRONIC DEVICES TO A VEHICLE HEADREST

CROSS-REFERENCE TO RELATED APPLICATIONS

This application is a Divisional of U.S. application Ser. No. 16/275,789, filed Feb. 14, 2019, which claims priority under 35 U.S.C. § 119(e) to U.S. Provisional Application No. 62/630,710 filed on Feb. 14, 2018, the entire contents of each of which are incorporated herein by reference as if fully rewritten.

BACKGROUND

The present disclosure is directed to the field of mounts for electronic devices within vehicles.

SUMMARY

This section provides a general summary of the disclosure, and is not a comprehensive disclosure of its full scope or all of its features.

According to at least one example embodiment, an apparatus is provided to attach an electronic device, such as a printer, to a vehicle headrest of a vehicle seat. The apparatus includes one or more attachment members configured to attach to a vehicle headrest mounting rod; a support structure attached to the one or more attachment members, the support structure extending outward from the one or more attachment members toward an edge of the vehicle headrest; and a back plate attached to the support structure, the back plate configured to hold the electronic device, wherein at least a portion of the electronic device is accessible from the vehicle seat.

According to at least one example embodiment, an apparatus may include a support structure that is configured to extend laterally, in at least one of a horizontal direction and/or a vertical direction, from the one or more attachment members to at least the edge of the vehicle headrest.

According to at least one example embodiment, an apparatus may include one or more attachment members, which include a clamping member having a first mating surface and a clamping arm having a second mating surface, the first mating surface and the second mating surface configured to be secured together by fasteners to fix the apparatus to the vehicle headrest mounting rod.

According to at least one example embodiment, an apparatus may include a support structure including a supporting chassis configured to fix to the clamping arm, a supporting arm configured to fix to the supporting chassis, and a back plate connector configured to connect the back plate to the supporting arm.

According to at least one example embodiment, an apparatus may include a support structure including an articulating arm that is configured to attach to the supporting arm at a pivot joint and a back plate connector that is configured to connect to the articulating arm.

According to at least one example embodiment, an apparatus may include an articulating arm that is configured to pivot at the pivot joint between a first position that positions the electronic device above the vehicle headrest while held by the back plate and a second position that positions the electronic device in front of the vehicle headrest while held by the back plate, wherein at least a portion of the electronic device is accessible from the vehicle seat while the articulating arm is pivoted in a second position.

According to at least one example embodiment, an apparatus may include a supporting arm that is configured to pivot between a first position and a second position, the first position positioning the electronic device behind the vehicle headrest while held by the back plate and the second position positioning the electronic device adjacent to the vehicle headrest while held by the back plate.

According to at least one example embodiment, an apparatus may include a supporting arm including at least one telescoping section that is configured to telescope the supporting arm.

According to at least one example embodiment, an apparatus may include at least one telescoping section that is configured to telescope the length of the supporting arm between at least a first telescopic length that positions the electronic device behind the vehicle headrest while held by the back plate and a second telescopic length that positions the electronic device adjacent to the vehicle headrest while held by the back plate.

According to at least one example embodiment, an apparatus may include a supporting arm that includes a sliding coupler that is configured to connect the back plate connector to the supporting arm along a slidable axis of the supporting arm, and the back plate connector is configured to connect the supporting arm at positions along the slidable axis.

According to at least one example embodiment, an apparatus may include a back plate connector that is configured to connect adjustably to the supporting arm at positions along the slidable axis of the supporting arm that include a first position that positions the electronic device behind the vehicle headrest while held by the back plate and a second selected position that positions the electronic device adjacent to the vehicle headrest while held by the back plate.

According to at least one example embodiment, an apparatus may include a supporting arm that is configured to at least one of rotate, pivot, slide, or gimbal relative to the supporting chassis.

According to at least one example embodiment, an apparatus may include a supporting arm that is configured to at least one of rotate, pivot, slide, or gimbal relative to the back plate.

According to at least one example embodiment, an apparatus may include a back plate that is configured to hold the electronic device in a forward-facing orientation that faces the vehicle headrest.

According to at least one example embodiment, an apparatus may include a back plate that includes a detachment member that detaches the electronic device from the back plate connector.

According to at least one example embodiment, an apparatus may include a back plate including a first mounting member that affixes with a second mounting member of the electronic device to the back plate.

According to at least one example embodiment, an apparatus may include a back plate that includes a clamp that adjusts to clamp the electronic device.

According to at least one example embodiment, an apparatus may include a back plate including a first mounting member and a mount adapter that is adapted to hold the electronic device, the mounting adapter including a second mounting member that affixes with the first mounting member.

According to at least one example embodiment, an apparatus may include a cable route that routes at least one cable of the electronic device.

According to at least one example embodiment, an apparatus may include a cable clip that affixes to at least one location of at least one cable of the electronic device.

According to at least one example embodiment, an apparatus may include one or more attachment means for attaching to a vehicle headrest mounting rod; a support means for attaching to the one or more attachment means and extending outward from the one or more attachment means toward an edge of a vehicle headrest; and a back plate means for attaching to the support means and for holding an electronic device, wherein at least a portion of the electronic device is accessible from the front seat.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected example embodiments and not all possible implementations, and are not intended to limit the scope of the present disclosure.

Corresponding reference numerals indicate corresponding parts throughout the several views of the drawings.

DETAILED DESCRIPTION

Figure 1:
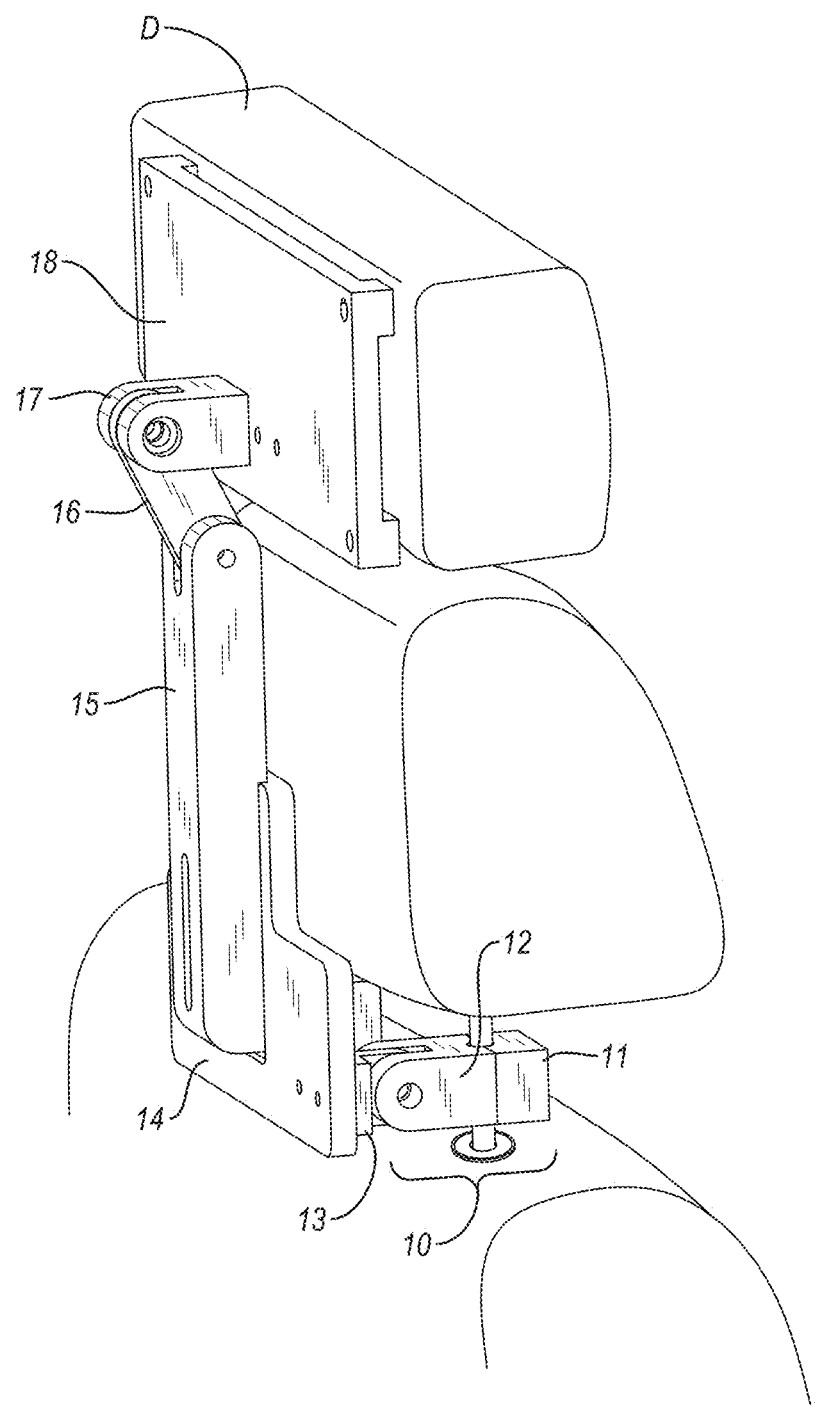
FIG. 1 is a perspective view of an example embodiment of an apparatus configured to affix an electronic device to a vehicle headrest.
Figure 2:
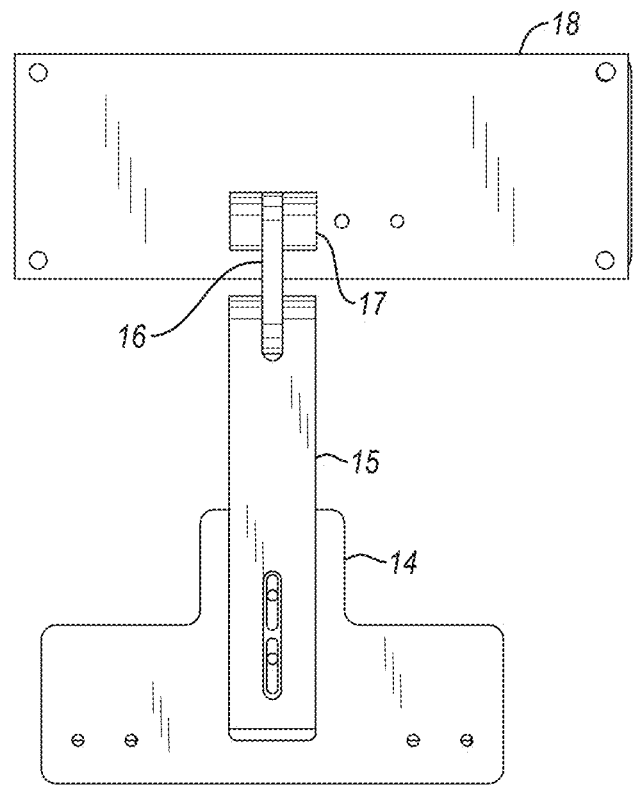
FIG. 2 is a rear view of the example embodiment of FIG. 1.
Figure 3:
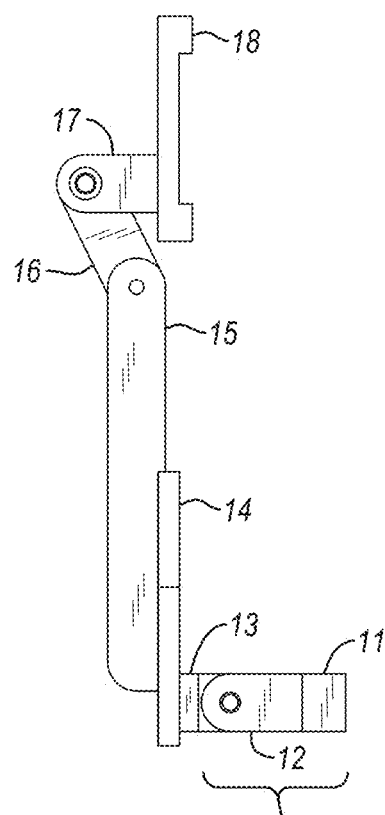
FIG. 3 is a side view of the example embodiment of FIG. 1.
Figure 4:
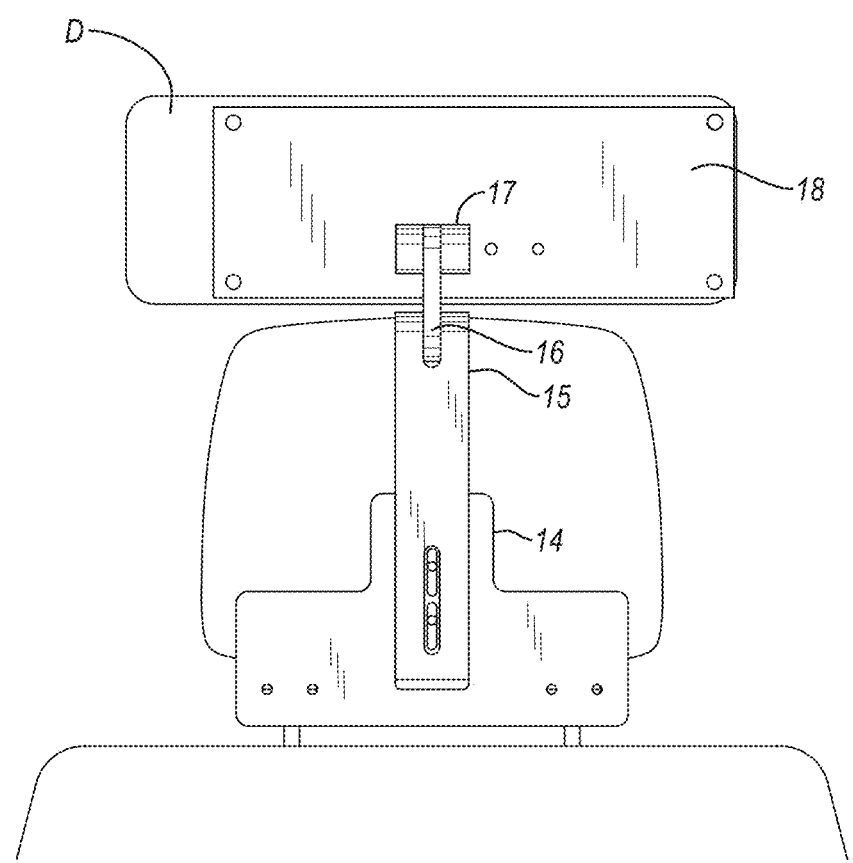
FIG. 4 is another rear view of the example embodiment of FIG. 1.

Example embodiments will now be described more fully with reference to the accompanying drawings.

Vehicles are increasingly being used as mobile workspaces that include electronic devices, such as printers, tablets, cameras, or the like. As an example, first responders (e.g, police, fire, and emergency medical service providers), members of the military, surveyors, engineers, and technical mobile operators often utilize electronic devices for a variety of tasks, such as communication, information retrieval, recording events and comments, self-defense, security, healthcare, and/or printing documents, such as parking tickets. Such electronic devices may be included in vehicles equipped with vehicle seats featuring vehicle headrests, such as cars, vans, shuttles, trucks, buses, trains, watercraft, and aircraft such as airplanes and helicopters.

The extensive amount of equipment utilized by such individuals may cause the passenger compartment cargo space of such vehicles to become crowded. Such crowding may create or exacerbate a cramping of the passenger space, leading to an uncomfortable and distracting experience. The cramping may prevent or delay access to the electronic device, or may cause the electronic device to block access to other equipment or portions of the vehicle, which may present an inconvenience or danger when such equipment is needed, particularly in emergency scenarios. For example, some electronic devices require the removal of a vehicle headrest to remove the electronic device from the vehicle for portable use and/or to re-mount the electronic device to the vehicle, but such configuration may delay, frustrate, and/or distract an individual who may be engaged in an emergency.

The location of equipment within a vehicle may present a variety of safety issues. As a first such example, equipment may obstruct or replace safety features of the vehicle, such as airbags, seatbelts, door locks, window controls, or headrests that cushion passengers in the event of a vehicle collision or an instance of hard braking, acceleration, or turning. As a second such example, equipment may become an impact hazard during a vehicle collision, particularly if the equipment detaches from a mount and becomes a projectile. As a third such example, equipment may obstruct a view of a driver or passenger, including peripheral vision or line of view with respect to rear-view mirrors, side-view mirrors, blind-spot mirrors, and/or cameras mounted within the vehicle. As a fourth such example, electronic devices may present a distraction, due to audio, visual, and/or tactile output that interferes with the attention of the driver or a passenger. As a fifth such example, equipment that replaces a component of the vehicle, such as a passenger headrest, may reduce the occupancy of the vehicle.

Electronic devices may present additional considerations for placement within a vehicle. As a first example, vehicle passenger compartments may become hot, cold, or exposed to moisture due to extended exposure to sunlight and weather conditions. Electronic devices that are mounted on a dashboard and are thereby exposed to direct sunlight, or that are mounted near devices that produce heat, such as other electronics or passenger compartment heating vents, may become overheated and may malfunction, particularly if the device includes a battery that may explode or leak if overheated. Such light and/or heat may cause the mount to warp or deform in a manner that causes it to lock the electronic device in place, preventing removal for maintenance or portable use, or to break and cause unmounting of the electronic device from the interior of the vehicle. As a second such example, electronic devices that are mounted to a door may become exposed to rain, snow, or ice while the vehicle is open, and/or may become dislodged due to opening or closing the door, possibly falling out of the vehicle. As a third such example, electronic devices often utilize cables to access power sources, such as batteries and/or the power system of the vehicle, and/or to communicate with other devices, such as peripherals, communication equipment, and/or the electronic control system of the vehicle. Loose or poorly routed cables may become self-tangled or tangled with other cables or equipment, and/or may disconnect or become severed, causing the device to lose power or a data link with other devices.

One or more example embodiments may facilitate mounting for electronic devices within vehicles. Example embodiments may position the device in a location that more efficiently uses the cargo space, which may be limited by the presence of other equipment. Example embodiments may position the electronic device in a location that is more convenient and/or more rapidly accessible, but that provides secure mounting and an option of stowing the electronic device when not in use. Example embodiments may position the device in a location that may be less obtrusive and/or that may not interfere with vehicle controls and/or safety equipment, and/or that does not require substitution and/or replacement of vehicle components, such as a dashboard mount that blocks a front- and/or side-mount airbag or a headrest mount that replaces a stock headrest of the vehicle. Example embodiments may provide a mechanism that is adaptable for a variety of vehicles, including vehicle seat types, and/or a variety of devices.

Example embodiments may provide a mounting mechanism for the electronic device in a manner that may resist detachment in the event of a vehicle accident and/or removal when a user wishes to maintain the electronic device or to use it in a portable manner. Example embodiments may provide a movable mounting mechanism that pivots, rotates, slides, extends, etc. to promote accessibility according to the needs of the user, the functionality of the electronic device, and/or the configuration of the passenger compartment of the vehicle. The position may be significant for electronic devices and equipment that are intended to be accessible to a driver or front-seat passenger, who are typically occupied with tasks such as vehicle operation and/or navigation; whom factors such as distraction, blocking of lines of vision, and passenger compartment cramping may create or exacerbate safety hazards; and who may wish to access the device from the front seat, such as while the vehicle is parked, or when the individual exits the vehicle. It may be appreciated that a large number of elements of the vehicle that typically surround the driver and front-seat passenger, for which obstruction may present a vehicle operation and/or safety issue (e.g., steering wheel, turn signal, controls such as wipers, transmission shifter, windshield, windows, rearview mirror, console including heads-up display, dashboard including front-impact airbags, radio, navigation system, display for rear-view camera, climate controls, doors including side-view mirrors and side-impact airbags, and seatbelts), as well as additional cargo space that may be utilized for other equipment, such as a glove compartment and center console. Example embodiments may provide a mounting location and mechanism for an electronic device that is more conveniently and/or more safely accessible to a driver and/or front-seat passenger, amidst the other elements within the passenger compartment of the vehicle.

In example embodiments, the position of the electronic device in the vehicle is adjacent to (e.g., behind, above, and/or aside) a vehicle headrest of a vehicle seat for a driver or passenger. This location is often unoccupied by equipment and may be less obtrusive to the driver (e.g., outside of the line of sight), and may therefore serve as a more convenient location to store and mount the electronic device while not in use. In example embodiments, the mount may position the electronic device such that the driver or front-seat passenger may access and/or utilize the electronic device in a relatively convenient manner, optionally positioning the electronic device in a forward- and/or side-facing orientation, in order to permit the driver or front-seat passenger to interact with the electronic device. In example embodiments, the mount may provide relatively convenient access to the driver and/or front-seat passenger to reach the electronic device, including to remove the electronic device from the mount for service or portable use and/or to remount the electronic device after such service or portable use. In example embodiments, a portion of the mount may at least one of rotate, pivot, slide, telescope, or gimbal, such that the electronic device is positioned adjacent to (e.g., behind, above, and/or aside) the vehicle headrest when not in use, but may be repositioned (e.g., further above, further aside, and/or in front of) the headrest to provide access for use without decoupling the electronic device from the mount. In example embodiments, the mount may be adaptable to a range of vehicles, headrest types, and/or electronic devices, and/or may include features that facilitate the storage, access, and/or functionality of the electronic device, such as the routing of cables between the electronic device and other devices and components of the vehicle.

FIGS. 1, 2, 3, and 4 present a set of views (a perspective view, a back view, a side view, and another back view) of a first example apparatus that mounts an electronic device (D) to a headrest of a vehicle in accordance with example embodiments.

Referring to FIGS. 1-4, the example apparatus includes attachment members 10 that are configured to attach to a vehicle headrest mounting rod. Each attachment member 10 includes a clamping member 11 and a clamping arm 12, each having a mating aperture that allows the clamping member 11 and clamping arm 12 to capture the vehicle headrest mounting rods. A clamping member 11 and clamping arm 12 may be secured together by screws, bolts, or other such fasteners. The clamping arm 12 may engage with articulating connectors 13, which may pivot, swivel, hinge or articulate. The clamping arms 12 and articulating connectors 13 may be secured together by an arbor, shaft, or other such fasteners. The example apparatus shown in FIGS. 1-4 also includes a support structure that is attached to the one or more attachment members 10, wherein the support structure extends outward from the one or more attachment members 10 toward an edge of the vehicle headrest. The support structure includes the articulating connectors 13 that are coupled to a chassis plate 14 (e.g., by screws, bolts or other fasteners); a supporting arm 15, which may project vertically; and an articulating arm 16. The supporting arm 15 may be fixed or slidable, and may be secured to the chassis plate 14 by screws, bolts, or other such fasteners. The supporting arm 15 may feature, at its distal end, an aperture, slot, cavity or other void that allows the supporting arm 15 to engage with the articulating arm 16, which may pivot, swivel, hinge, articulate, etc. The articulating arm 16 may be configured to connect to the supporting arm 15 by an arbor, shaft, bolt, or other such fastener. The projecting end of the articulating arm 16 may be configured to engage with an aperture, slot, cavity, or other void in a back plate connector 17. The example apparatus shown in FIGS. 1-4 includes a back plate 18 attached to the support structure via the back plate connector 17, wherein the back plate 18 is configured to hold the electronic device D, and wherein at least a portion of the electronic device D may be accessible from the front seat. The back plate connector 17 is connected to the articulating arm 16 (e.g., by an arbor, shaft, bolt, or other such fastener) and/or configured to mate with the back plate 18 (e.g., by screws, bolts, or other such fasteners). The back plate 18 may be configured to connect to an electronic device via voids or apertures whereby screws, bolts, or other such fasteners may fixably or releasably hold the electronic devices.

As further shown in FIGS. 1-4, the example apparatus may be clamped to the vehicle headrest support rod or rods by connecting and securing the clamping members 11 and clamping arms 12 around the headrest support rod or rods, between the bottom of the headrest and the top of the seat back. The articulating connectors 13 may be adjustable to position the chassis plate 14 behind the vehicle headrest (e.g., perpendicular to the back of the vehicle headrest and/or in contact with the vehicle headrest), which may promote the stability of the apparatus while mounted to the vehicle headrest. The arbors, shafts, or other such fasteners that connect the clamping arms 12 and the articulating connectors 13 may be tightened, locked, and/or pinned to secure or lock them in multiple positions.

The supporting arm 15 and the articulating arm 16 may pivot relative to one another and the arbor, shaft, or other fastener connecting said supporting arm 15 to the articulating arm 16 may be tightened, locked or pinned to secure or lock the supporting arm 15 and the articulating arm 16 in multiple positions. The pivoting or rotating adjustment of said supporting arm 15 and said articulating arm 16 may allow the back plate connector 17 mated to the back plate 18 to be positioned so that the electronic device may be positioned above, in front of, or behind the headrest; in a usable position or alternately out of the way of the headrest.

The following comments relate to components that may be included in at least some example embodiments. It is to be appreciated that some variations of such components may be combined with other variations. It is to be appreciated that some variations may be present alternative configurations for a component of some example embodiments.

According to one or more example embodiments, a first variation of the example apparatus may include an attachment member that attaches to one vehicle headrest mounting rod, or that attaches to two or more vehicle headrest mounting rods, or two or more attachment members that respectively attach to one or more of the vehicle headrest mounting rods.

In another variation, an attachment member may attach to a vehicle headrest mounting rod in a variety of ways. As a first such example, the attachment member may include a clamping member having a first mating surface and a clamping arm having a second mating surface, wherein the first mating surface and the second mating surface are configured to be secured together by fasteners (e.g., screws, nuts and bolts, staples, interlocking pins, adhesive, hook-and-loop fasteners, etc.) to fix the apparatus to the vehicle headrest mounting rod. As a second such example, an attachment member may include a body with an aperture that surrounds a vehicle headrest mounting rod; for example, the vehicle headrest may be detached from a vehicle seat, a vehicle headrest mounting rod may be inserted through the aperture, and the vehicle headrest may be re-attached to the vehicle seat. As a third such example, an attachment member may include one or more cords, straps, loops, etc. that may be tied around and/or together to affix to one or more of the vehicle headrest mounting rods.

In another variation, an attachment member may tightly affix to one or more of the vehicle headrest mounting rods. Alternatively, an attachment member may more loosely affix to one or more of the vehicle headrest mounting rods, such that at least the attachment member may slide (e.g., vertically) on the vehicle headrest mounting rod (e.g., may provide vertical adjustability and/or to absorb shock due to vertical vehicle movement).

In another variation, an attachment member may be affixed in a permanent or semi-permanent manner, such as using an adhesive that affixes to the vehicle headrest mounting rods. Alternatively, an attachment member may be affixed in a removable manner, such as using a clasp that may be opened to attach and/or detach to a vehicle headrest mounting rod, and that may be closed to affix the apparatus to a vehicle headrest mounting rod. In at least some example embodiments, the attachment member may include a security locking mechanism that secures the attachment member to the vehicle headrest mounting rod unless unlocked in a secure manner (e.g., with a physical key). Many such types of attachment members may be included in example embodiments.

In one variation of the support structure according to example embodiments, the support structure may include a solid member. Alternatively, one or more portions of the support structure may include apertures, cutouts, and/or hollow spaces (e.g., to reduce a weight, bulk, and/or material composition of the support structure).

In another variation of the support structure according to example embodiments, the support structure may exhibit a variety of physical configurations. For example, the support structure may extend laterally, in at least one of a horizontal direction and a vertical direction, from the one or more attachment members to at least the edge of the vehicle headrest, and optionally beyond the edge of the vehicle headrest.

In another example of this variation, the support structure may include a supporting arm, which may provide a variety of forms of structural support and/or adaptability to the mounting of the electronic device. In some example embodiments, the support structure may include a supporting chassis that is configured to fix to the clamping arm; a supporting arm that is configured to fix to the supporting chassis; and a back plate connector that is configured to connect the back plate to the supporting arm. In various example embodiments, the supporting arm may be configured to rotate, pivot, slide, or gimbal relative to the supporting chassis to vary the position and/or orientation of the electronic device.

In another example of this variation, the supporting arm may include an articulating arm that is configured to attach to the supporting arm at a pivot joint, where the back plate connector is configured to connect to the articulating arm. In at least one example embodiment, the articulating arm is configured to pivot at the pivot joint between a first selected position that positions the electronic device above the vehicle headrest while held by the back plate, and a second position that positions the electronic device in front of the vehicle headrest while held by the back plate, wherein at least a portion of the electronic device is accessible from the vehicle seat while the articulating arm is pivoted in the second selected position.

In another example of this variation, the supporting arm may connect to the supporting chassis using a pivot joint, such that the supporting arm, including the back plate and the electronic device, may pivot to various positions. In at least some example embodiments, the supporting arm may be configured to pivot between a first selected position that positions the electronic device behind the vehicle headrest while held by the back plate and a second selected position that positions the electronic device adjacent to the vehicle headrest while held by the back plate, and at least a portion of the electronic device is accessible from the vehicle seat while the supporting arm is in the second selected position.

In another example of this variation, the supporting arm may include at least one telescoping section that is configured to telescope the supporting arm to various lengths. In at least one such example embodiment, at least one telescoping section of the supporting arm is configured to telescope the length of the supporting arm between at least a first telescopic length that positions the electronic device behind the vehicle headrest while held by the back plate, and a second telescopic length that positions the electronic device adjacent to the vehicle headrest while held by the back plate, wherein at least a portion of the electronic device is accessible from the vehicle seat while the sliding coupler is in the second selected position.

In another example of this variation, the supporting arm may be configured to connect the back plate connector to the supporting arm along a slidable axis of the supporting arm, and the back plate connector may be configured to connect adjustably to the supporting arm at selected positions along the slidable axis. In at least one such example embodiment, the selected positions along the slidable axis of the supporting arm may include a first selected position that positions the electronic device behind the vehicle headrest while held by the back plate, and a second selected position that positions the electronic device adjacent to the vehicle headrest while held by the back plate, wherein at least a portion of the electronic device is accessible from the vehicle seat while the sliding coupler is in the second selected position. Many such configurations of the supporting arm may be included in example embodiments.

One or more example embodiments may include a back plate that holds an electronic device.

In a variation of the back plate according to example embodiments, the back plate may hold a variety of electronic devices. In example embodiments, such electronic devices may include, for example and without limitation: a printer, a scanner, a portable computer such as a tablet or palmtop form factor, a display, a speaker, a microphone, a communication device such as a mobile phone or radio, a camera that captures still or moving images, a wearable device such as a headset or earpiece, a monitoring device such as night-vision goggles, and/or electronic self-defense equipment.

In another example of this variation, the back plate may be configured to hold the electronic device in a forward-facing orientation that faces the vehicle headrest. For example, the electronic device may include a front surface featuring a display and/or user controls such as buttons or a touchpad, and the back plate may be configured to orient the front surface of the device toward the vehicle headrest, and hence toward a front of the vehicle, when the electronic device is held by the back plate. This orientation may enable the driver or a front-seat passenger to turn around and utilize the electronic device while still mounted in the apparatus (e.g., while the vehicle is stopped). Alternatively, the back plate is configured to hold the electronic device in an angled and/or side-facing orientation with respect to the vehicle headrest, for example, when the electronic device is held by an apparatus that is affixed to the vehicle headrest of the driver, a front-seat passenger may be able to turn sideways to access the electronic device). Some electronic devices may feature top-, bottom-, and/or side-located features, such as a button or a paper dispenser of a printer, such that when the electronic device is held by the back plate in a forward-oriented configuration, the top-, side-, and/or back-located feature may be accessible. For example, a paper dispensing port of a printer may be able to dispense paper out the side of a printer that a front-seat driver or passenger may be able to reach even while the electronic device is mounted in a position that is behind the vehicle headrest.

In another example of this variation, the back plate may permanently or semi-permanently hold the electronic device (e.g., with a fixed bolt or adhesive). Alternatively, the back plate may removably hold the electronic device (e.g., via a detachment member that detaches the electronic device from the back plate connector). Such detachment members may include, for example, a releasable clasp, an adjustable clamp, hook-and-loop connectors, snap or button, magnetic couplers, interlocking structural components, or the like.

In another example of this variation, the back plate may be integrated with an electronic device. For example, the back plate may be manufactured together with and/or permanently affixed to the electronic device, which may include a singular article or unit.

In another example of this variation, the back plate may be adapted to hold a particular device or a particular class of devices. For example, the back plate may include a first mounting member that affixes with a second mounting member of a particular electronic device, or with a class of electronic devices that commonly feature and/or are adaptable to feature the second mounting member.

In another example of this variation, the back plate may be adapted to hold a variety of devices. In example embodiments, the back plate may include a clamp that adjusts to clamp an electronic device (e.g., a vertical clamp that adjusts vertically to clamp to a top edge and bottom edge of the electronic device, and/or a horizontal clamp that adjusts vertically to clamp to a left edge and right edge of the electronic device). In another example, the back plate may include a container, pouch, or envelope that holds the electronic device, optionally with one or more cut-outs or windows that provide access to at least a portion of the device. In another example, the back plate may feature mounting holes, and a variety of general-use fasteners, such as screws or nuts and bolts, may affix the electronic device with the back plate. In another example, a mount adapter may be utilized to affix to the back plate and to a particular electronic device. For example, the back plate may include a first mounting member, and the apparatus and/or the electronic device may include a mount adapter that is adapted to hold a particular electronic device and that includes a second mounting member that affixes with the first mounting member.

In another example of this variation, the back plate may be rigid and may hold the electronic device in a single, fixed orientation. Alternatively, the back plate may affix to the support structure and/or articulating arm via a joint that may rotate, pivot, slide, gimbal, etc., to enable a change of position and/or orientation of the electronic device. For example, the back plate connector may be a pivoting arm or gimbal that is engaged with the back plate. Many such variations in the configuration of the back plate may be included in example embodiments.

Figure 5A:
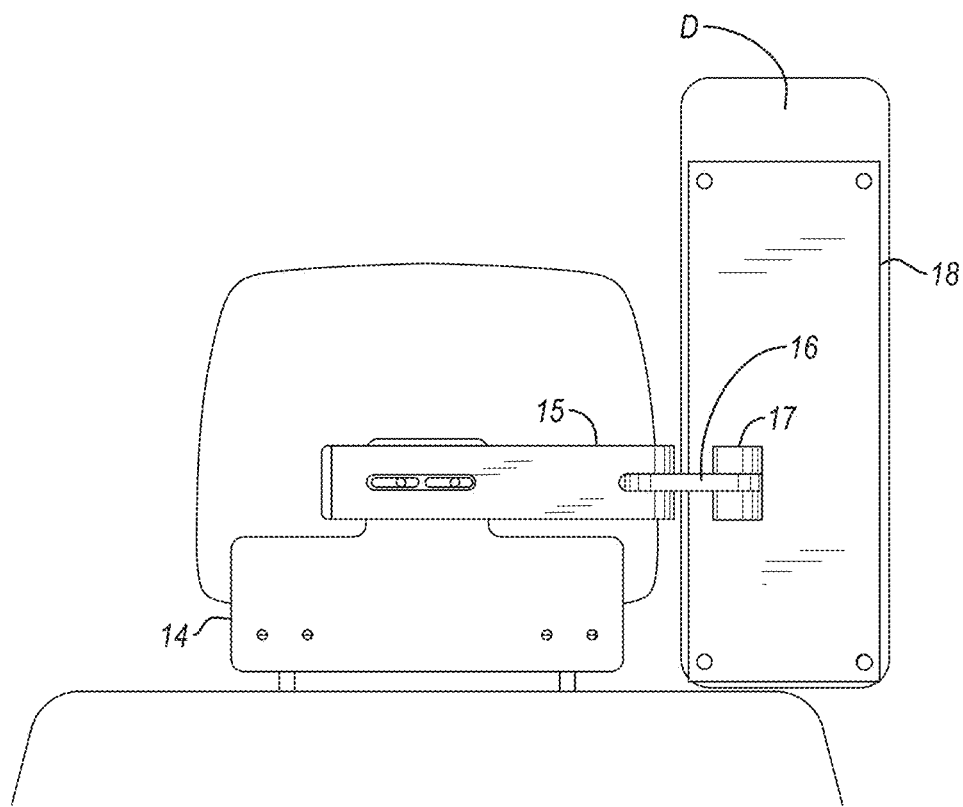
FIG. 5A is a rear view of another example embodiment of an apparatus configured to affix an electronic device to a vehicle headrest.
Figure 5B:
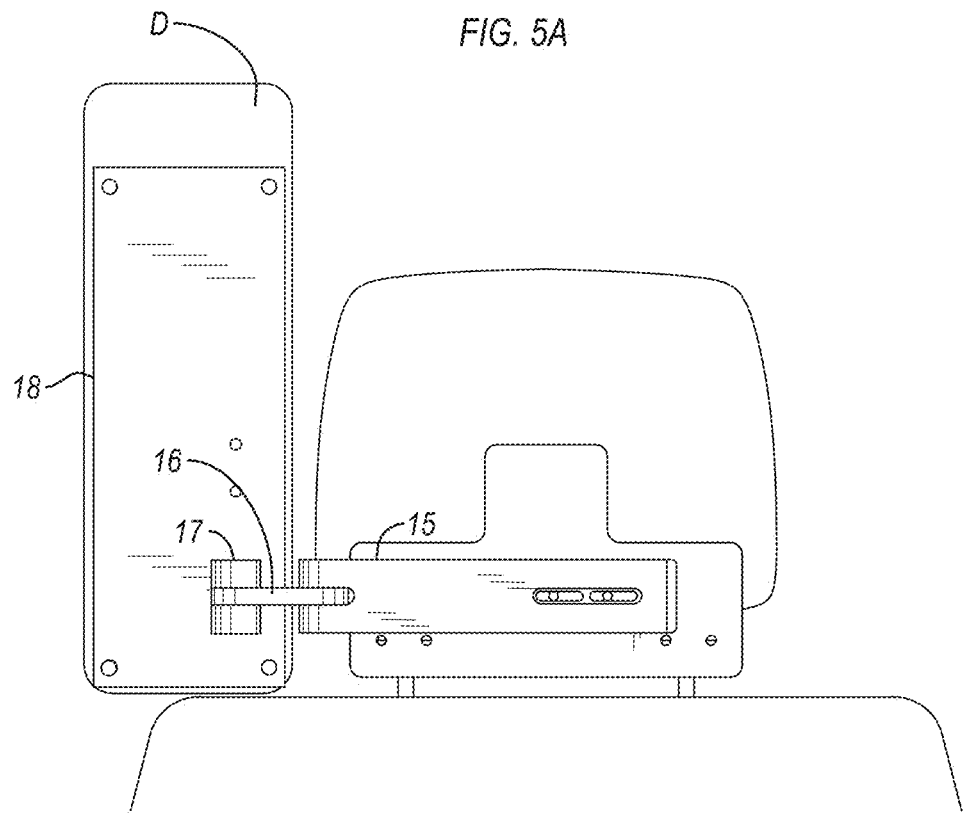
FIG. 5B is a rear view of another example embodiment of an apparatus configured to affix an electronic device to a vehicle headrest.

FIGS. 5A-5B present other example embodiments of apparatuses configured to affix an electronic device to a vehicle headrest. In these example embodiments, the supporting arm is configurable.

The example embodiments shown in FIGS. 5A and 5B are similar to the example apparatus shown in FIGS. 1-4, except with regard to the connection between the supporting arm 15 and the chassis plate 14, and with regard to the orientation of the supporting arm 15, the articulating arm 16, the back plate connector 17, the back plate 18 and the electronic device D.

In the example embodiment shown in FIG. 5A, the supporting arm 15 is pivoted to a horizontal orientation (rather than a vertical orientation as shown in FIGS. 1-4) with respect to the chassis plate 14. The articulating arm 16 and back plate connector 17 are oriented to the side of the vehicle headrest. The back plate 18 is mated with the back plate connector 17 in a vertical orientation. The supporting arm 15 is attached to the chassis plate 14 at an upper portion of the chassis plate 14.

The example embodiment shown in FIG. 5B is similar to the example embodiment shown in FIG. 5A, except that the supporting arm 15 is pivoted to an opposite horizontal orientation relative to the example embodiment shown in FIG. 5A and the supporting arm 15 is attached to a middle portion of the chassis plate 14.

Figure 6:
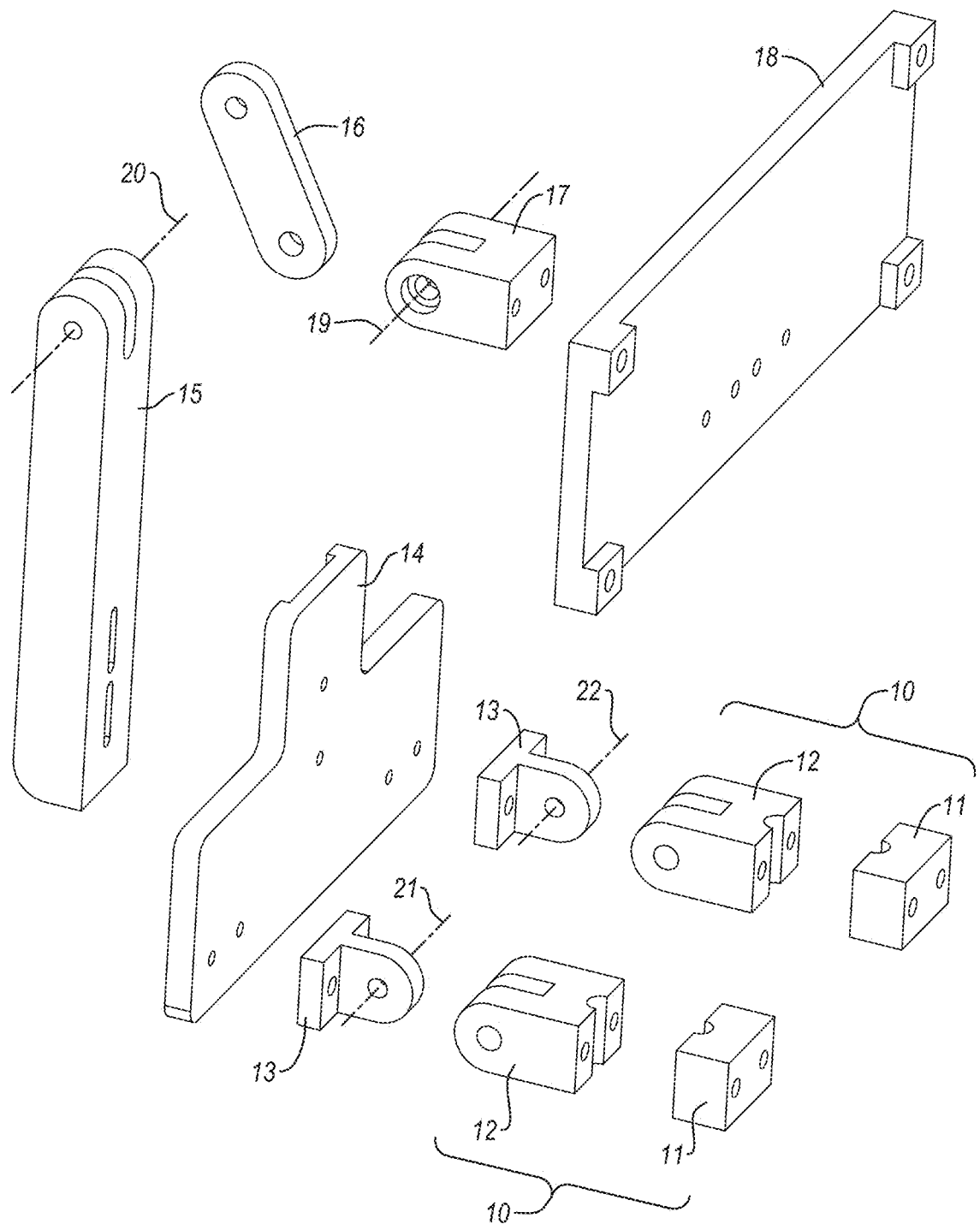
FIG. 6 is an exploded component view of a portion of the example embodiment of FIG. 4.

FIG. 6 presents an exploded component view of the example apparatus shown in FIGS. 1-4. In FIG. 6, a pair of clamping members 11 and clamping arms 12 may be fastened together around two vehicle headrest mounting rods; a pair of articulating connectors 13 may be fixed into slots of the clamping arms 12 via connectors such as arbors, shafts, or other such fasteners inserted into the apertures 21, 22. A chassis plate 14 may be affixed to the articulating connectors 13. A supporting arm 15 may be movably affixed to the chassis plate 14. An articulating arm 16 may be fixed into a slot of the supporting arm 15 via a connector such as an arbor, shaft, or other such fastener inserted into a supporting arm aperture 20. A back plate connector 17 may be connected to the articulating arm 16 via an arbor, shaft, or other such fastener inserted into a back plate connector aperture 19. A back plate 18 may be affixed to the back plate connector 17 and may hold the electronic device.

Figure 7:
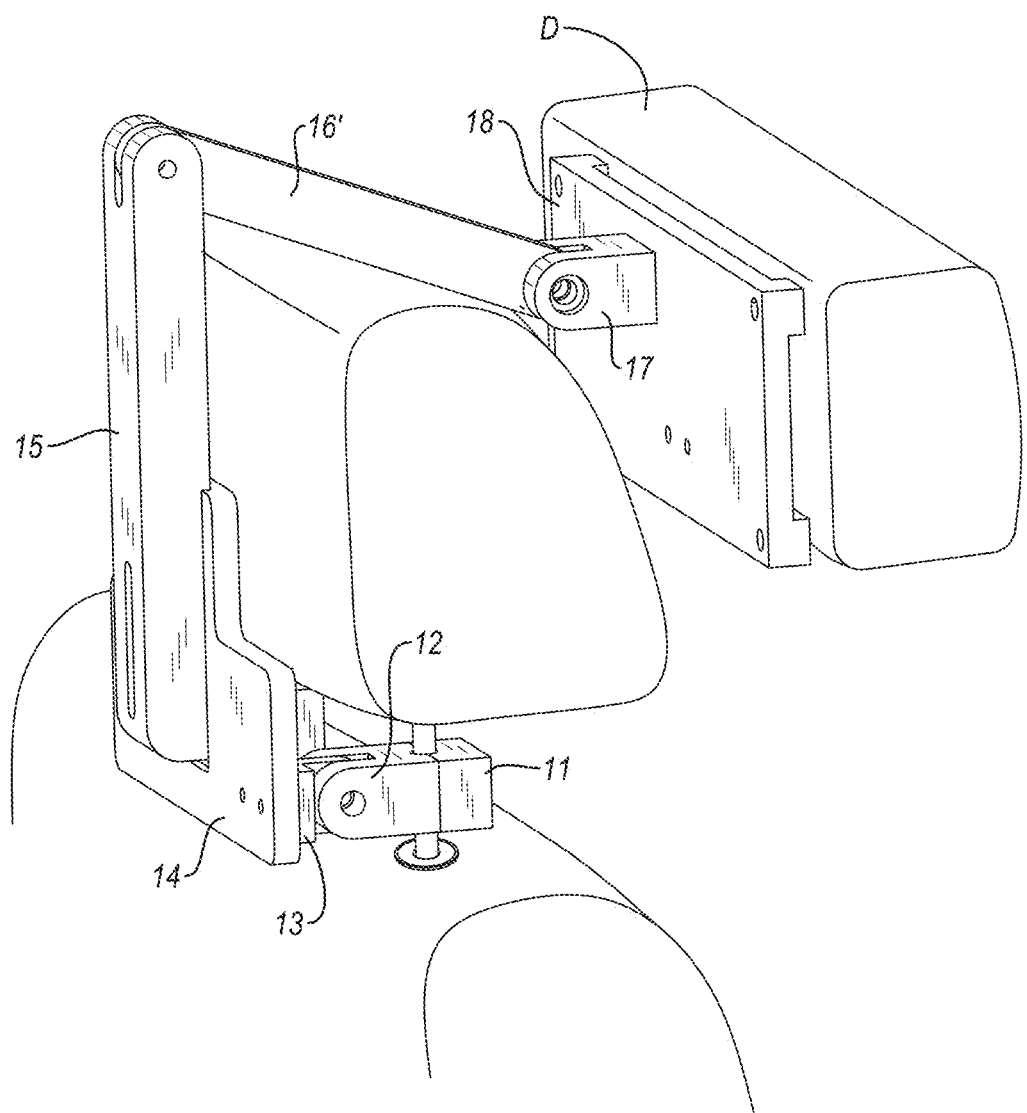
FIG. 7 is a perspective view of another example embodiment of an apparatus configured to affix an electronic device to a vehicle headrest.

FIG. 7 presents a perspective view of another example embodiment. In this example embodiment, the supporting arm 15 is vertically oriented, and an articulating arm 16' is connected to the supporting arm 15 via a pivot joint that allows the articulating arm 16' to pivot forward and backward. Additionally, the articulating arm 16' connects to the back plate connector 17 and the back plate 18 via a second pivot joint, which allows an adjustable orientation of the back plate 18 and the electronic device D. While the articulating arm 16' is pivoted to a substantially upward or vertical orientation, the electronic device D may be positioned above the vehicle headrest. While the articulating arm 16' is pivoted to a substantially forward or horizontal orientation, the electronic device D may be positioned in front of the vehicle headrest, and may be more readily accessible to a driver and/or front-seat passenger.

Figure 8:
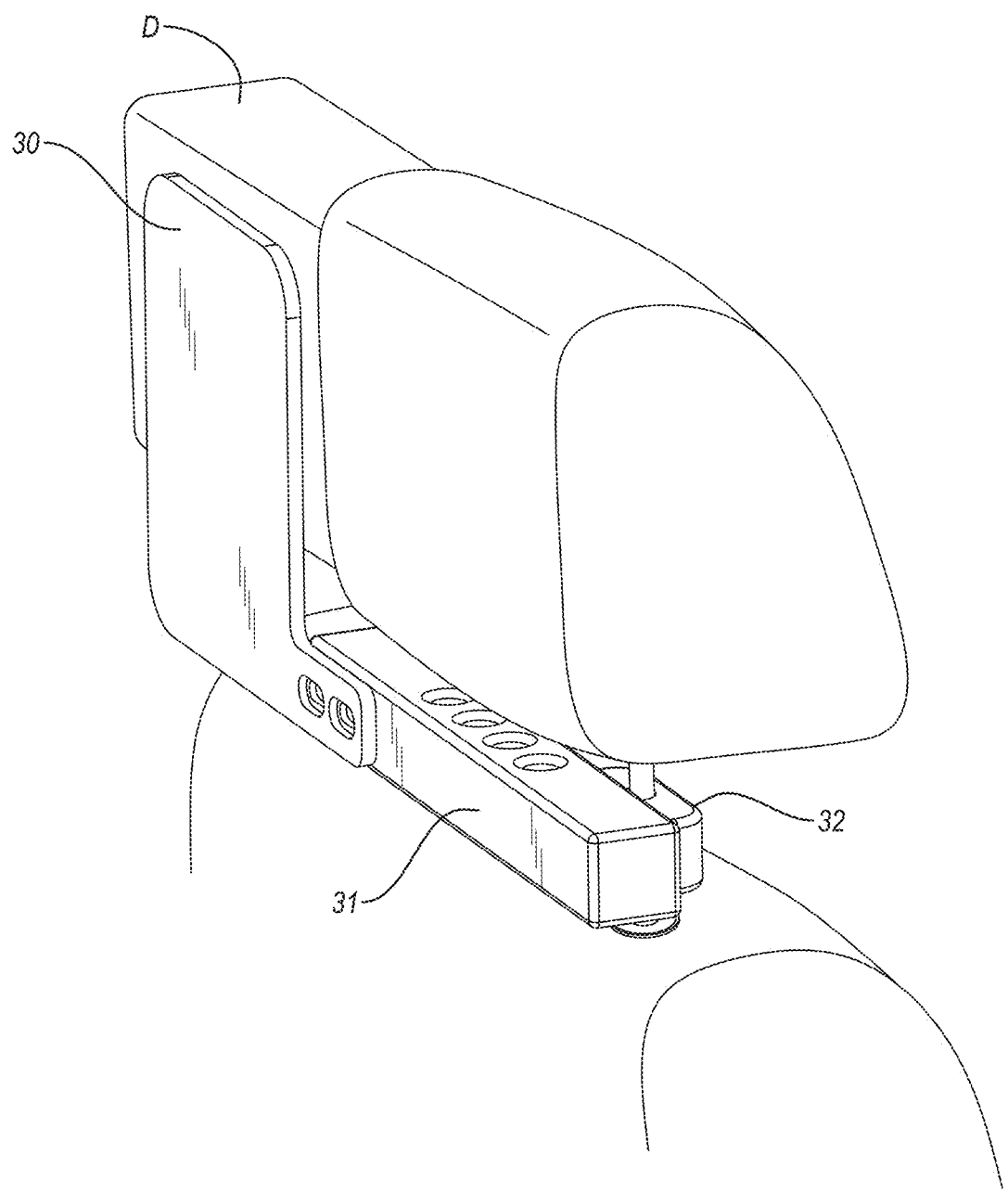
FIG. 8 is a perspective view of another example embodiment of an apparatus configured to affix an electronic device to a vehicle headrest.

FIG. 8 presents a perspective view of another example embodiment. In this example embodiment, a support structure 31 is oriented substantially horizontally, projecting toward a left edge of the vehicle headrest. Two solid-body members 32 (only one of which is visible in this perspective view) are integrated with the support structure 31, where each solid-body members 32 includes an aperture that the vehicle headrest mounting rod slides through to secure the apparatus to the headrest. A vertically oriented back plate 30 is fixably connected to the support structure 31 and configured to hold an electronic device in a vertical orientation adjacent to the vehicle headrest. Although shown as solid-body members 32 integrated with the support structure 31, the solid-body members 32 may be connectors that may be fixed to the support structure 31 as discussed in more detail below with regard to FIG. 11.

Figure 9:
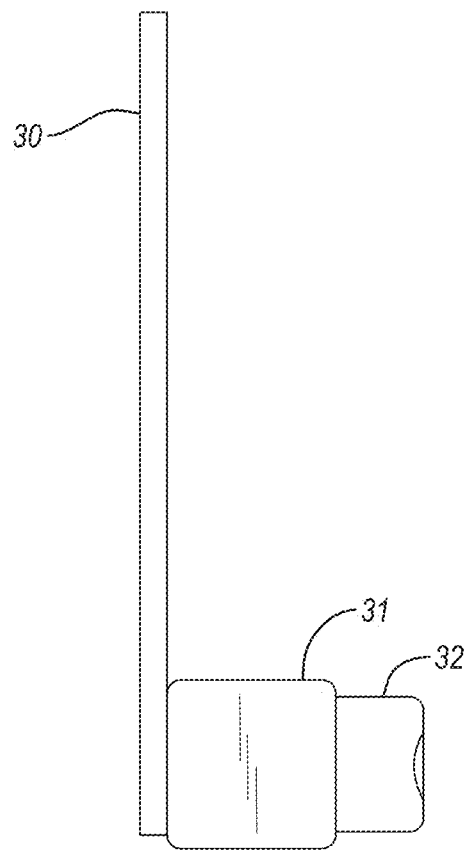
FIG. 9 is a side view of a portion of the example embodiment of FIG. 8.

FIG. 9 presents a side view of the elements of the example embodiment of FIG. 8. In FIG. 9, the support structure 31 is positioned behind the solid-body members 32 (only one of which is visible in this side view), and the vertically oriented back plate 30 is positioned behind the support structure 31, such that the electronic device held by the vertically oriented back plate 30 is positioned at least partially behind the vehicle headrest. This configuration may reduce the impingement of the electronic device, while held by the vertically oriented back plate 30, into the passenger space near the head of a driver or front-seat passenger.

Figure 10:
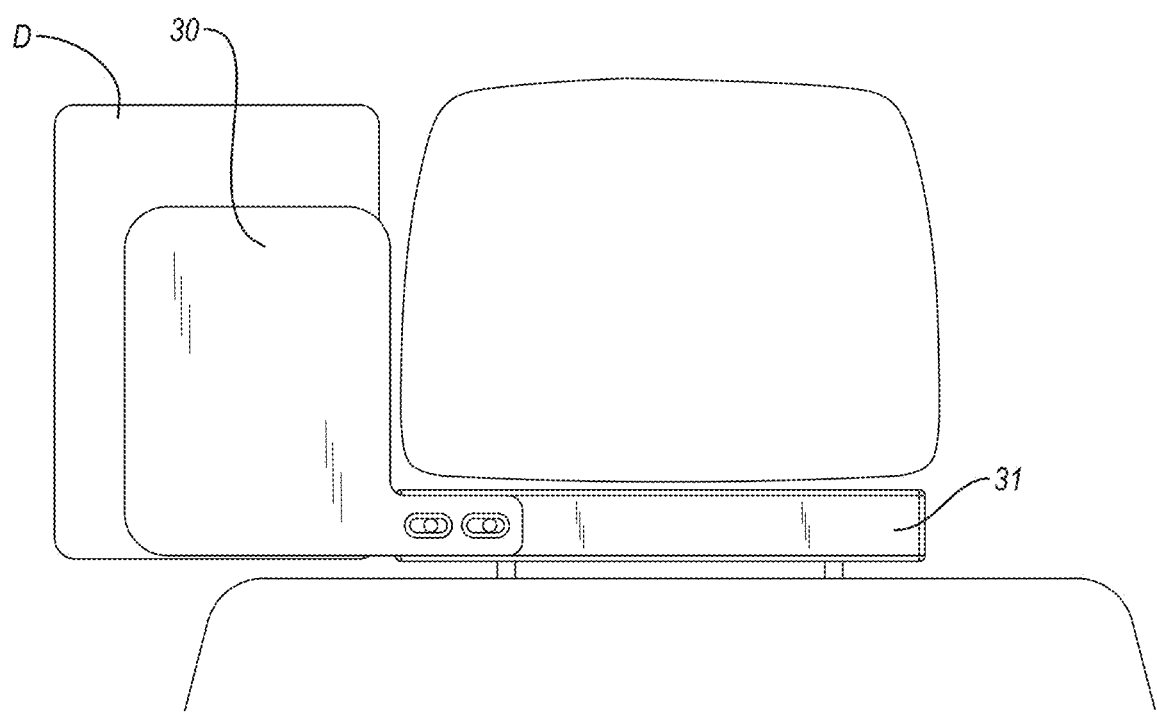
FIG. 10 is a rear view of another example embodiment of an apparatus configured to affix an electronic device to a vehicle headrest.

FIG. 10 presents a back view of another example embodiment of an apparatus to affix an electronic device to a vehicle headrest.

The example embodiment shown in FIG. 10 is similar to the example embodiment shown in FIG. 8, except that the electronic device D is oriented differently and the vertically oriented back plate 30 and the electronic device D are spaced apart from the vehicle headrest to further remove the electronic device from the passenger space near the head of the driver or front-seat passenger.

Figure 11:
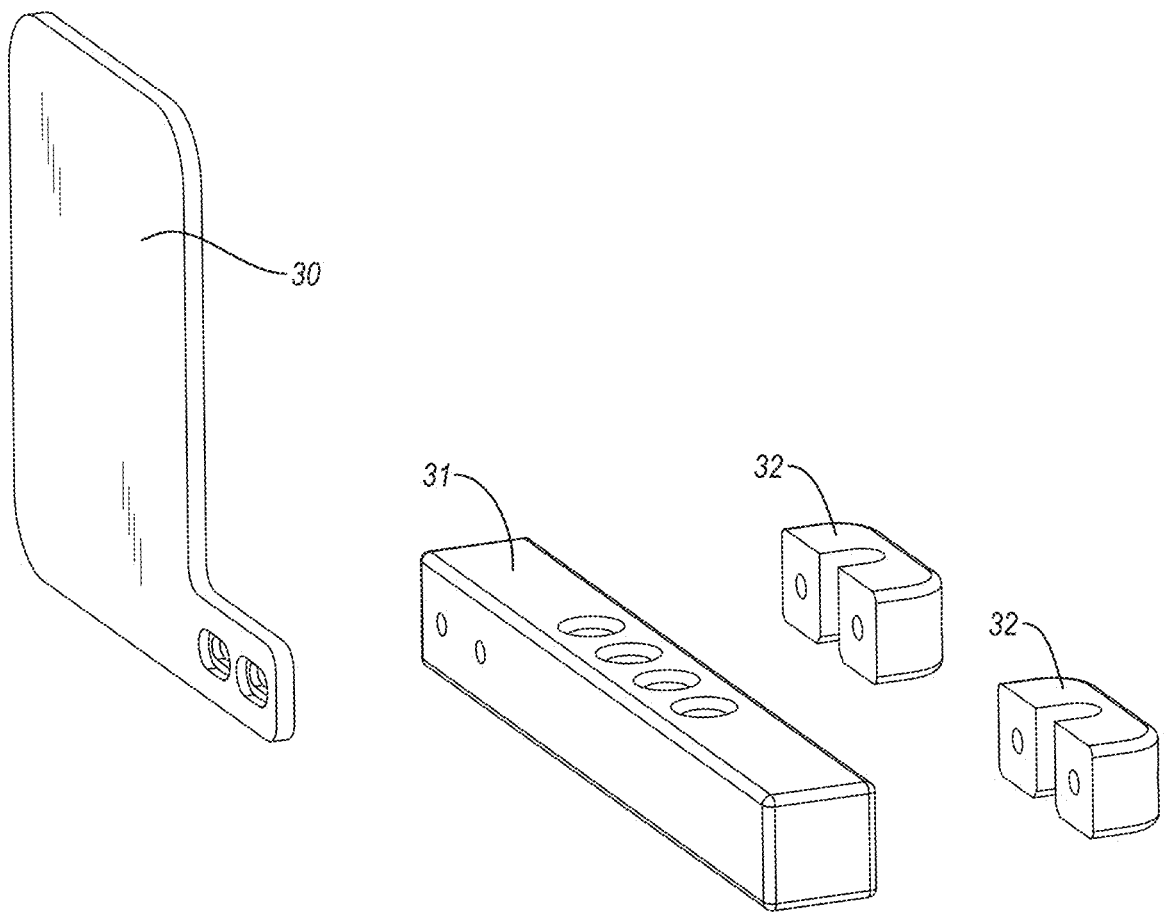
FIG. 11 is an exploded view of the example embodiment of FIG. 10.

FIG. 11 presents an exploded component view of a set of components that may together form one or more of the example embodiments of FIGS. 8-10, wherein the solid-body members 32 (referred to here as solid-body connectors 32') are not integral, but separate components with regard to the support structure 31. In the example embodiment shown in FIG. 11, the solid-body connectors 32' include a cutout, rather than an aperture, and apertures (not shown in FIG. 11) the solid-body connectors 32' may affix to the support structure 31 using fasteners that pass through corresponding apertures (not shown in FIG. 11) in the support structure 31. The support structure 31 includes cutouts that may reduce the weight of the support structure 31. The vertically oriented back plate 30 also includes apertures that may be used to fasten the vertically oriented back plate 30 to the support structure 31.

According to at least some example embodiments, apparatuses according to one or more example embodiments may include features to provide routing of one or more cables of the electronic device, such as power cables that connect the electronic device to a battery or the power system of the vehicle and/or data cables that connect the electronic device to other electronic devices within the vehicle, such as a radio or transponder. In an example embodiment, the apparatus may include one or more cable routes, such as a cutout, grove, channel, tube, conduit, or raceway, that route at least one cable of the electronic device along a length of the apparatus and/or with respect to the vehicle headrest and/or vehicle seat. In another example embodiment, the apparatus may include one or more cable clips that respectively affix to at least one location of at least one cable of the electronic device to a body of the apparatus. In another example embodiment, the apparatus may integrate one or more cables that are configured to interconnect between a cable, connector, and/or port of the electronic device with one or more cables, connectors, and/or ports of one or more power sources and/or other devices within the vehicle.

At least some example embodiments may include features that assist the functionality of the electronic device. For example, a printer that is mounted to a vehicle headrest may require a supply of paper, and may include a paper compartment to store paper; a spool that holds a roll of paper; and/or a paper feed mechanism that feeds paper into and/or out of the printer.

At least some example embodiments may include a power supply for the electronic device, such as a power converter or transformer (e.g., an A/C-to-D/C adapter) or a rechargeable battery.

At least some example embodiments may include one or more antennae that provide wireless communication between a transponder of the electronic device and a remote transponder of a remote device.

At least some example embodiments may include one or more locking mechanisms that lock the apparatus, optionally including the electronic device, to the vehicle headrest and/or the vehicle seat. Such locking mechanisms may resist removal of the electronic device from the mounting to the vehicle headrest and/or the vehicle seat until unlocked (e.g., with a physical key).

At least some example embodiments may include a shield that protects at least a portion of the electronic device from physical forces and/or exposure, such as weather, impact, and/or tampering by an individual, such as a passenger in a back seat of the vehicle.

At least some example embodiments may include impact-resistant structural members that maintain the rigidity of the apparatus in the event of physical force (e.g., impact during a vehicle accident). For example, the apparatus may include a brace that braces the apparatus against the vehicle seat or another portion of the vehicle, such as a side post.

At least some example embodiments may include padding that cushions the apparatus (e.g., to reduce injury to a passenger in a back seat of the vehicle during a vehicle accident). Many such additional features may be included in example embodiments.

According to at least some example embodiments, the attachment members, supporting arm, back plate, or the like may be made of materials such as aluminum, steel, and plastics including carbon-fiber supplemented plastics, and alloys or composites thereof. Some example embodiments may utilize one material for all components; other example embodiments may utilize different materials for one or more components, such as a more rigid material for supporting structural components that are rigid (e.g., the supporting arm) and a more flexible material for components that are desired to flex (e.g., an engagement member that releasably engages the electronic device).

Various manufacturing techniques may be utilized to manufacture various example embodiments. In one example, various manufacturing techniques may be utilized for one or more components, such as computer numerical control (CNC) machining or milling, casting, injection molding, and/or printing. In another example, two or more manufacturing components may be manufactured together, and optionally integrated during a single manufacturing process. Alternatively, one or more manufacturing techniques may be utilized for two or more components, optionally including all components, as separate components that are then joined (e.g., using bolts, welding, or coupling units integrated with the respective components).

According to at least one example embodiment, an apparatus may include one or more attachment means for attaching to a vehicle headrest mounting rod, such as, for example, the attachment member 10 of FIGS. 1-4; the attachment member 10 of FIGS. 5A, 5B, and 6; the attachment member 10 of FIG. 7; and/or the attachment member 10 of FIGS. 8-9. The apparatus may include a support means for attaching to the one or more attachment means and extending outward from the one or more attachment means toward an edge of a vehicle headrest, such as, for example, the support structure 15 of FIGS. 1-4; the support structure 15 of FIGS. 5A, 5B, and 6; the support structure 15 of FIG. 7; and/or the support structure 15 of FIGS. 8-9. The apparatus may include back plate means for attaching to the support means and for holding an electronic device, wherein at least a portion of the electronic device is accessible from the front seat, such as, for example, the back plate 18 of FIGS. 1-4; the back plate 18 of FIGS. 5A, 5B, and 6; the back plate 18 of FIG. 7; and/or the back plate 18 of FIGS. 8-9.

The foregoing description of example embodiments has been provided for purposes of illustration and description. It is not intended to be exhaustive or to limit the disclosure. Individual elements or features of an example embodiment are generally not limited to that particular example embodiment, but, where applicable, are interchangeable and can be used in a selected example embodiment, even if not specifically shown or described. The same may also be varied in many ways. Such variations are not to be regarded as a departure from the disclosure, and all such modifications are intended to be included within the scope of the disclosure. Equivalent alterations and modifications will occur to others skilled in the art based upon a reading and understanding of this specification and the annexed drawings. The disclosure includes all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure which performs the function in the herein illustrated example implementations of the disclosure. While a particular feature of the disclosure may have been disclosed with respect to only one of several implementations, such feature may be combined with one or more other features of the other implementations as may be desired and advantageous for any given or particular application. To the extent that the terms "includes", "having", "has", "with", or variants thereof are used in either the detailed description or the claims, such terms are intended to be inclusive in a manner similar to the term "comprising."

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

Any aspect or design described herein as an "example" is not necessarily to be construed as advantageous over other aspects or designs. Rather, use of the word "example" is intended to present one possible aspect and/or implementation that may pertain to the techniques presented herein. Such examples are not necessary for such techniques or intended to be limiting. Various example embodiments of such techniques may include such an example, alone or in combination with other features, and/or may vary and/or omit the illustrated example.

The terminology used herein is for the purpose of describing particular example embodiments only and is not intended to be limiting. As used herein, the singular forms "a," "an," and "the" may be intended to include the plural forms as well, unless the context clearly indicates otherwise. That is, "a" and "an" as used in this application and the appended claims may generally be construed to mean "one or more" unless specified otherwise or clear from context to be directed to a singular form. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on," "engaged to," "connected to," or "coupled to" another element or layer, it may be directly on, engaged, connected or coupled to the other element or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.)

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The invention claimed is:

1. An apparatus to attach an electronic device to a vehicle headrest of a vehicle seat, the apparatus comprising:
   a mounting structure configured to be mounted to the vehicle headrest, the mounting structure including a support structure configured to extend outward toward a lateral side of the vehicle headrest when the mounting structure is mounted to the vehicle headrest; and
   a back plate having a first surface attached to the support structure, the back plate configured to hold the electronic device on the first surface to position the electronic device at the lateral side of the vehicle headrest.

2. The apparatus of claim 1, wherein at least a portion of the electronic device is accessible from the vehicle seat.

3. The apparatus of claim 1, wherein the mounting structure further comprises:
   at least two body connectors configured to engage with the support structure to attach the mounting structure to the vehicle headrest.

4. The apparatus of claim 3, wherein the each of the at least two body connectors engages with the support structure to secure the mounting structure to a respective mounting rod of the vehicle headrest.

5. The apparatus of claim 3, wherein the at least two body connectors are integral with the support structure.

6. The apparatus of claim 3, wherein the support structure is configured to extend in a horizontal direction from the at least two body connectors to at least a lateral edge of the vehicle headrest.

7. The apparatus of claim 1, wherein the back plate is fixed to the support structure by fasteners.

8. The apparatus of claim 1, wherein the back plate is configured to hold the electronic device in a forward-facing orientation at the lateral side of the vehicle headrest.

9. The apparatus of claim 1, further comprising:
   a cable route that routes at least one cable of the electronic device.

10. The apparatus of claim 1, further comprising:
    a cable clip that affixes to at least one location of at least one cable of the electronic device.

11. The apparatus of claim 1, wherein the back plate is L-shaped.

12. The apparatus of claim 1, wherein the back plate extends in a horizontal direction and a vertical direction relative to the support structure.

13. The apparatus of claim 1, wherein the back plate is fixed directly to the support structure.

14. The apparatus of claim 1, wherein the back plate comprises:
    a first portion configured to hold the electronic device; and
    a second portion configured to be secured to the support structure; wherein the second portion is smaller than the first portion.

15. The apparatus of claim 14, wherein the first portion and the second portion form an L-shape.

16. An apparatus to attach an electronic device to a vehicle headrest of a vehicle seat, the apparatus comprising:
    a mounting structure configured to be mounted to the vehicle headrest, the mounting structure including a support structure configured to extend outward toward a lateral side of the vehicle headrest when the mounting structure is mounted to the vehicle headrest; and
    an L-shaped back plate having a first portion and a second portion, the first portion configured to hold the electronic device on a first surface to position the electronic device at the lateral side of the vehicle headrest, and the second portion being secured to the support structure.

17. The apparatus of claim 16, wherein the L-shaped back plate is configured to hold the electronic device in a forward-facing orientation at the lateral side of the vehicle headrest.

18. The apparatus of claim 16, wherein the second portion of the L-shaped back plate is secured directly to the support structure.

19. The apparatus of claim 16, wherein the second portion is smaller than the first portion.

20. The apparatus of claim 16, wherein
the second portion is secured to the support structure on a first surface of the second portion, and
the first surface of the second portion and the first surface of the first portion form a same first surface of the L-shaped back plate.

* * * * *